(12) United States Patent
Johansson et al.

(10) Patent No.: US 9,236,891 B2
(45) Date of Patent: Jan. 12, 2016

(54) RADIO COMMUNICATION TRANSMITTER APPARATUS AND METHOD

(75) Inventors: Bernt Johansson, Värmdö (SE); Bo Berglund, Uppsala (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 14/398,504

(22) PCT Filed: May 3, 2012

(86) PCT No.: PCT/SE2012/050464
§ 371 (c)(1),
(2), (4) Date: Nov. 3, 2014

(87) PCT Pub. No.: WO2013/165288
PCT Pub. Date: Nov. 7, 2013

(65) Prior Publication Data
US 2015/0092880 A1 Apr. 2, 2015

(51) Int. Cl.
*H04B 1/04* (2006.01)
*H04B 1/00* (2006.01)

(52) U.S. Cl.
CPC ............... *H04B 1/04* (2013.01); *H04B 1/0053* (2013.01); *H04B 1/0003* (2013.01); *H04B 2001/0425* (2013.01)

(58) Field of Classification Search
CPC ..................... H03F 2201/3233; H04L 27/367; H04L 27/2626; H04L 1/3241; H04L 1/3252; H04L 2201/3227; H04B 1/04; H04B 1/0483; H04B 1/0475; H04B 2001/0408; H04B 2001/0416; H04B 2001/0425; H04B 2001/0433; H04B 10/58
USPC ......................................... 375/295, 296, 297
See application file for complete search history.

(56) References Cited

U.S. PATENT DOCUMENTS

2002/0021764 A1* 2/2002 Posti .............................. 375/296
2003/0227964 A1* 12/2003 Honkanen et al. ............ 375/216

(Continued)

FOREIGN PATENT DOCUMENTS

EP 2528293 A1 11/2012
WO 2007076495 A2 7/2007

(Continued)

OTHER PUBLICATIONS

Mekechuk, et al., "Linearizing Power Amplifiers Using Digital Predistortion, EDA Tools and Test Hardware", High Frequency Electronics, High Frequency Design Amplifier Linearization, Summit Technical Media, LLC, 2004, 18-27.

*Primary Examiner* — Leon Flores
(74) *Attorney, Agent, or Firm* — Patent Portfolio Builders, PLLC

(57) ABSTRACT

A radio communication transmitter apparatus 20 is operable to transmit multiple radio frequency bands in a telecommunication system. The apparatus comprises a plurality of digital transmitter chains $21_1$ to $21_N$, wherein each digital transmitter chain is coupled to receive a digital representation $27_1$ to $27_N$ of a respective base band signal for processing by a respective digital transmitter chain. Each digital transmitter chain $21_1$ to $21_N$ comprises a digital transmitter $25_1$ to $25_N$ that is adapted to convert a respective digital base band signal directly into a digital representation of a radio frequency signal $23_1$ to $23_N$. A digital combining unit 25 is coupled to receive the output of each digital transmitter chain $21_1$ to $21_N$, and adapted to combine the digital representation of a radio frequency signal $23_1$ to $23_N$ received from each digital transmitter chain $21_1$ to $21_N$ into a digital representation of a radio frequency signal 26 comprising multiple radio frequency bands. A digital to analogue converter 27 is coupled to receive the digital representation of a radio frequency signal 26 comprising multiple radio frequency bands, and adapted to convert the digital representation of a radio frequency signal 26 into an analogue radio frequency signal 28 comprising multiple radio frequency bands.

16 Claims, 9 Drawing Sheets

(56) References Cited

U.S. PATENT DOCUMENTS

| | | |
|---|---|---|
| 2004/0005014 A1 | 1/2004 | Talwar et al. |
| 2005/0085198 A1 | 4/2005 | Anvari |
| 2005/0136859 A1 | 6/2005 | Anvari |
| 2008/0238544 A1* | 10/2008 | Morris et al. ............ 330/149 |
| 2011/0156815 A1 | 6/2011 | Kim et al. |
| 2012/0128099 A1 | 5/2012 | Morris et al. |
| 2012/0155572 A1 | 6/2012 | Kim et al. |

FOREIGN PATENT DOCUMENTS

| | | |
|---|---|---|
| WO | 2010124297 A1 | 10/2010 |
| WO | 2012092647 A1 | 7/2012 |
| WO | 2012119178 A1 | 9/2012 |

* cited by examiner

RADIO COMMUNICATION TRANSMITTER APPARATUS AND METHOD

TECHNICAL FIELD

The present invention relates to a radio communication transmitter apparatus operable to transmit multiple radio frequency bands in a telecommunication system, and to a method performed in such an apparatus.

BACKGROUND

For many years the deployment of telecommunication systems, for different standards and many frequency bands, has been realized to a large extent by placing radio base stations (RBS) in cellular networks covering large areas. An important link in a traditional radio base station architecture is between the active parts of the system (that is the digital and analog components of the system) to the passive parts (such as the filters and antennas). This high-power analog radio-frequency (RF) link is critical in the sense that it sometimes requires long cables of high quality and large dimensions, in order keep the unavoidable signal quality losses and power losses to a minimum. Such links suffer from the disadvantage of having high costs.

There has been a recent change to integrate the power amplifier and other RF blocks more closely with the physical antenna in order to avoid this critical link, and has resulted in what is termed an integrated antenna unit (IAU). The introduction of an IAU implies a change from RF feeders into a high-speed digital interface between a digital processing unit (DPU) and the IAU.

In order to implement a base station today with two or more frequency bands, several complete transmitters are combined on the analogue side after a transmission filter.

Thus, when implementing transmitters for multiple frequency bands, two or more transmitters are implemented in the analogue domain, one transmitter for each frequency band.

FIG. 1 shows a known dual band transmitter having two digital transmitters $110_1$, $110_2$ for handling first and second frequency bands, the digital transmitters feeding first and second digital pre-distortion units (DPDs) $111_1$, $111_2$. The output of each DPD $111_1$, $111_2$ is converted into an analogue signal by a respective one of first and second digital to analogue converters $112_1$, $112_2$. A separate analogue up-converter $113_1$, $113_2$ is provided for converting each analogue baseband signal into a respective analogue RF signal. Each analogue up-converter $113_1$, $113_2$ is controlled by a respective tunable local oscillator $114_1$, $114_2$. The outputs from the first and second analogue up-converters $113_1$, $113_2$ are combined in an analogue combiner 115, before being fed to a power amplifier 116 (which feeds an antenna or antenna array, not shown). It will be appreciated that the transmitter shown in FIG. 1 is bulky, since it comprises multiple DPDs $111_1$, $111_2$, multiple DACs $112_1$, $112_2$ and multiple analogue up-converters $113_1$, $113_2$.

Furthermore, since tuneable local oscillators $114_1$, $114_2$ are required per transmitter chain, these have the disadvantage in that each requires tuning control, additional space and increased power consumption.

FIG. 1 also shows a feedback path for feeding a dual-band DPD processing unit 117. The feedback path comprises an analogue splitter 118, which feeds first and second analogue down-converters $119_1$, $119_2$, which in turn feed first and second transmitter observation receivers (TORs) $120_1$, $120_2$. The outputs from the first and second TORs $120_1$, $120_2$ are used for controlling the DPDs $111_1$, $111_2$. The transmitter shown in FIG. 1 is therefore bulky because it also requires multiple analogue down-converters $119_1$, $119_2$ and multiple TORs $120_1$, $120_2$. Further, the multiple analogue down-converters $119_1$, $119_2$ in the TOR chain also require separate tuneable local oscillators.

It can be seen from the above that the conventional technology has a disadvantage in that the multi band transmitters become bulky, particularly as more and more frequency bands are introduced, and have low energy efficiency and increased manufacturing cost due to the fact that several complete RF transmitters or several transmitter components in the analogue domain are used to implement the multi band transmitters.

SUMMARY

It is an aim of the present invention to provide a method and apparatus which obviate or reduce at least one or more of the disadvantages mentioned above.

According to a first aspect of the invention, there is provided a radio communication transmitter apparatus that is operable to transmit multiple radio frequency bands in a telecommunication system. The apparatus comprises a plurality of digital transmitter chains, wherein each digital transmitter chain is coupled to receive a digital representation of a base band signal, and wherein each digital transmitter chain comprises a digital transmitter that is configured to convert a respective digital base band signal directly into a digital representation of a radio frequency signal. A digital combining unit is coupled to receive the output of each digital transmitter chain, and adapted to combine the digital representation of a radio frequency signal received from each digital transmitter chain into a digital representation of a radio frequency signal comprising multiple radio frequency bands. A digital to analogue converter is coupled to receive the digital representation of a radio frequency signal comprising multiple radio frequency bands, and adapted to convert the digital representation of a radio frequency signal into an analogue radio frequency signal comprising multiple radio frequency bands.

This has the advantage of enabling a less bulky transmitter apparatus to be provided for handling multiple frequency bands. For example, the use of the digital transmitter chains, as defined above, enable common components to be shared.

According to another aspect of the present invention, there is provided a method in a radio communication transmitter apparatus that is operable to transmit multiple radio frequency bands in a telecommunication system. The method comprises the steps receiving in each of a plurality of digital transmitter chains a digital representation of a respective base band signal for processing by a respective digital transmitter chain, and converting at each digital transmitter chain a respective digital radio base band signal directly into a digital representation of a radio frequency signal. The digital representation of a radio frequency signal of each digital transmitter chain is combined into a digital representation of a radio frequency signal comprising multiple radio frequency bands. The digital representation of a radio frequency signal comprising multiple radio frequency bands is converted into an analogue radio frequency signal comprising multiple radio frequency bands.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

The embodiments of the invention provide implementations of a multi band radio frequency (RF) transmitter apparatus that enable common components to be shared. The embodiments of the invention will be described in relation to using Direct Radio Frequency Technology (DRF) in the digital domain. It is noted, however, that other implementations of digital transmitter apparatus may be used, which provide the same functions as discussed below.

Figure 1:
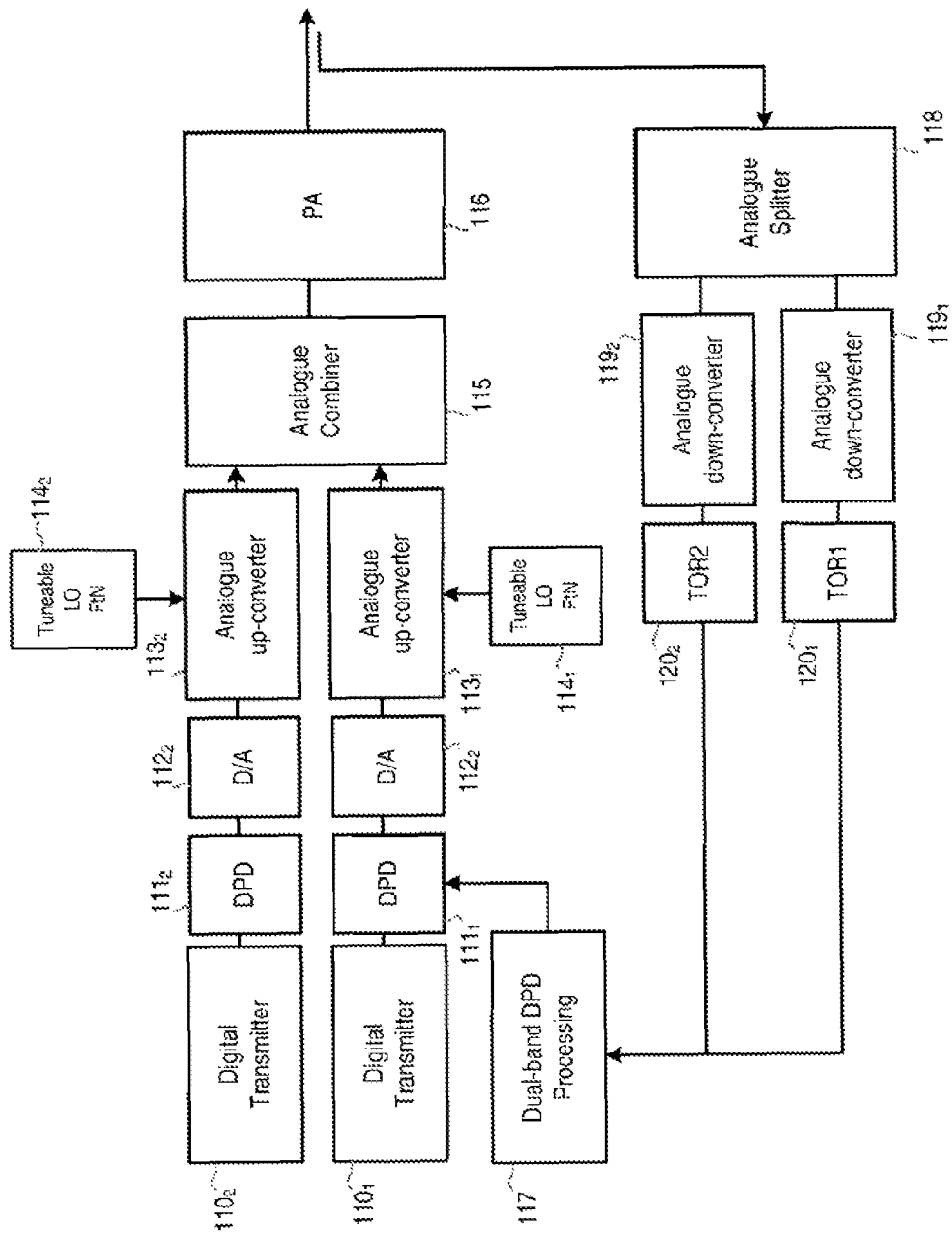
FIG. 1 shows a radio communication transmitter apparatus according to the prior art.
Figure 2A:
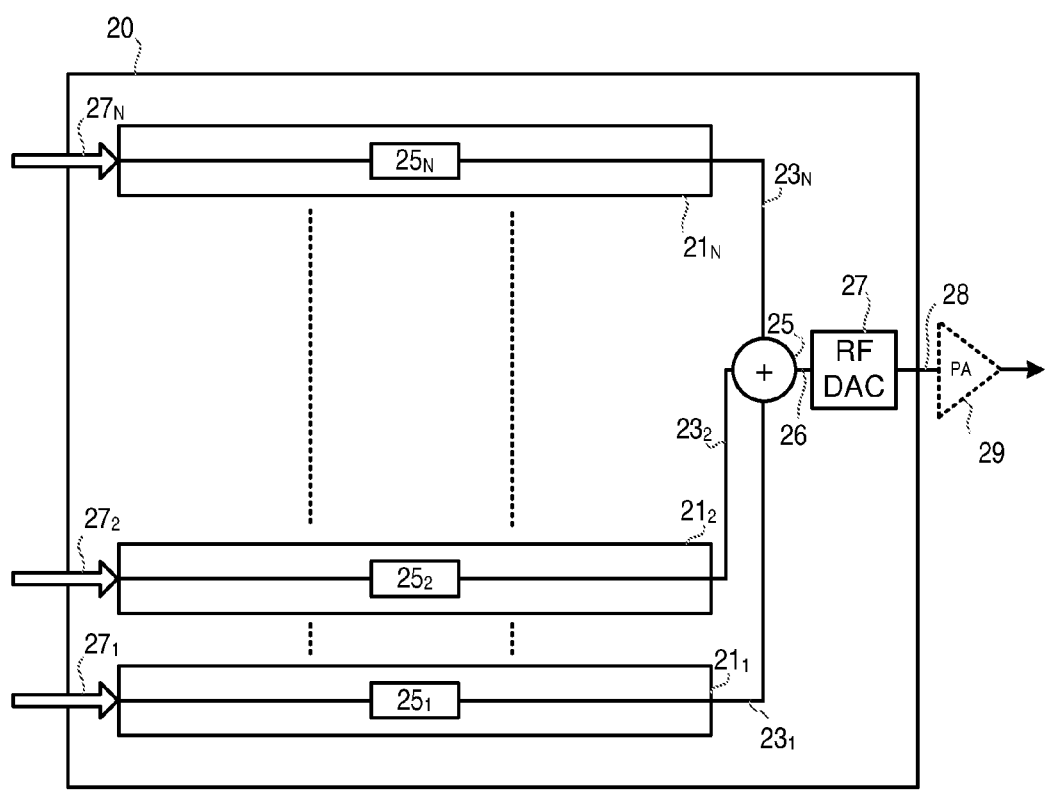
FIG. 2a shows a radio communication transmitter apparatus according to an embodiment of the present invention.

FIG. 2a shows a radio communication transmitter apparatus 20 according to an embodiment of the present invention. The radio communication transmitter apparatus 20 is operable to transmit multiple radio frequency bands in a telecommunication system. The radio communication transmitter apparatus 20 comprises a plurality of digital transmitter chains $21_1$ to $21_N$. Each digital transmitter chain is coupled to receive a digital representation $27_1$ to $27_N$ of a respective base band signal. Each digital transmitter train $21_1$ to $21_N$ comprises a digital transmitter $25_1$ to $25_N$ that is configured to convert (up-convert) a digital baseband signal directly into a digital representation of a radio frequency signal $23_1$ to $23_N$. A digital transmitter $25_1$ to $25_N$ of FIG. 2a (and the other embodiments described below) may comprise, for example, a digital transmitter that is configured to up-convert a digital base band signal directly to a digital representation of a radio frequency signal using Direct Radio Frequency Technology, DRF.

A digital combining unit 25, for example a digital summing unit, is coupled to receive the output of each digital transmitter chain $21_1$ to $21_N$, and adapted to combine the digital representation of a radio frequency signal $23_1$ to $23_N$ received from each digital transmitter chain $21_1$ to $21_N$ into a digital representation of a radio frequency signal 26 comprising multiple radio frequency bands. The digital combining unit 25 may be realised as a field programmable gate array (FPGA), for example, or some other form of digital processing device for processing the digital RF signals. The digital combining unit 25 preferably has processing capabilities, including but not limited to high processing speed and/or a high clock rate, to handle the wide bandwidths associated with the multiple band signals.

A digital to analogue converter 27 is coupled to receive the digital representation of a radio frequency signal 26 comprising multiple radio frequency bands, and adapted to convert the digital representation of a radio frequency signal 26 into an analogue radio frequency signal 28 comprising multiple radio frequency bands. As will be described later in the application, this output 28 of the digital to analogue converter 27 may be processed downstream prior to being coupled to a power amplifier or a transmit antenna.

The digital to analogue converter 27 is preferably a high speed digital to analogue converter, such that it is capable of processing the multiple frequency band signals. The digital to analogue converter 27 is preferably configured to support a high sample rate at RF frequency, with the sample frequency preferably being at least the same as half the highest frequency of operation f_max for operation in the 1st Nyquist zone, the same as f_max when operating in the 2nd Nyquist zone and ⅔ f_max for operation in the 3rd Nyquist zone.

The digital to analogue converter 27 may be configured to work in a so called mixed mode that supports operation in at least the 1st and 2nd Nyquist zone, but possibly also the 3rd Nyquist zone. The digital to analogue converter 27 is driven with a fixed clock frequency, without any tuning or frequency shifting. The digital to analogue converter preferably has a high dynamic range, i.e. high SFDR (Spurious free dynamic range) and low noise.

It can therefore be seen from FIG. 2a that the separate signals corresponding to each frequency band are up converted by the digital transmitter units and combined digitally by the digital combining unit, prior to being converted from digital to analogue format. This has the advantage of removing the need for multiple analogue up-converters to be provided. This also has the advantage of enabling other components to be shared, as will be described in the embodiments below.

It is noted that the signals received by the digital transmitters $25_1$ to $25_N$ and/or output from the digital transmitters $25_1$ to $25_N$ may be subject to various processing techniques, as will be described further in relation to the other embodiments of the invention.

The embodiment of FIG. 2a has the advantage of providing a frequency agnostic transmitter, and can be easily adapted or programmed to handle any range or combination of multiple radio frequency bands. The frequency range and combinations of multiple radio frequency bands can be set within the limits imposed by the highest sample rate f_max in combination with the performance of other components, such as an anti aliasing filter performance used with the embodiments of FIGS. 6, 7 and 8 below. The apparatus therefore enables a multi band, multi carrier and multi antenna transmitter to be realized.

This has the advantage of enabling a less bulky transmitter apparatus to be provided for handling multiple frequency bands. For example, the use of the digital transmitter chains as defined above enable common components to be shared.

According to an alternative embodiment, each digital transmitter chain may be coupled to receive multiple base band signals in digital form, including a digital base band signal for processing by the respective digital transmitter chain. In such an embodiment each digital transmitter $25_1$ to $25_N$ may be programmable to select a particular base band signal from the digital representation of multiple base band signals $27_1$ to $27_N$, and adapted to convert the selected digital base band signal into a digital representation of a radio frequency signal $23_1$ to $23_N$, for example using a DRF transmitter.

Figure 2B:
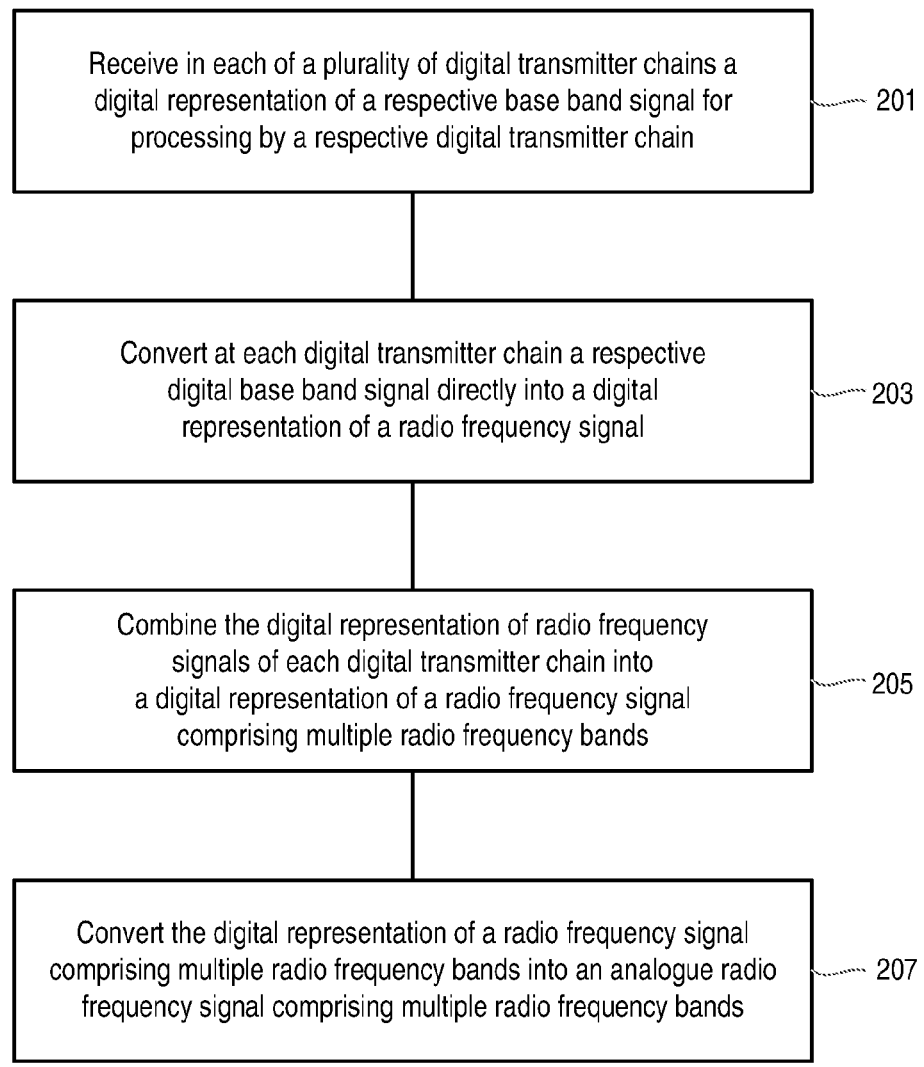
FIG. 2b shows the steps performed in a radio communication transmitter apparatus according to an embodiment of the present invention.

FIG. 2b shows the steps performed by a radio communication transmitter apparatus according to an embodiment of the present invention, which is operable to transmit multiple radio frequency bands. In step 201 the method comprises the step of receiving in a plurality of digital transmitter chains $21_1$ to $21_N$ a digital representation $27_1$ to $27_N$ of a respective base band signal. Each digital transmitter chain $21_1$ to $21_N$ converts a respective digital base band signal into a digital representation of a radio frequency signal $23_1$ to $23_N$, step 203. For example, each digital transmitter train $21_1$ to $21_N$ may comprise a digital transmitter $25_1$ to $25_N$ that is configured to up-convert a digital baseband signal directly to a digital representation of a radio frequency signal $23_1$ to $23_N$, for example using a DRF transmitter. The digital representation of a radio frequency signal $23_1$ to $23_N$ of each digital transmitter chain $21_1$ to $21_N$ is combined, step 205, into a digital representation of a radio frequency signal comprising multiple radio frequency bands. The digital representation of a radio frequency signal comprising multiple radio frequency bands is then converted into an analogue radio frequency signal comprising multiple radio frequency bands, step 207.

Figure 3:
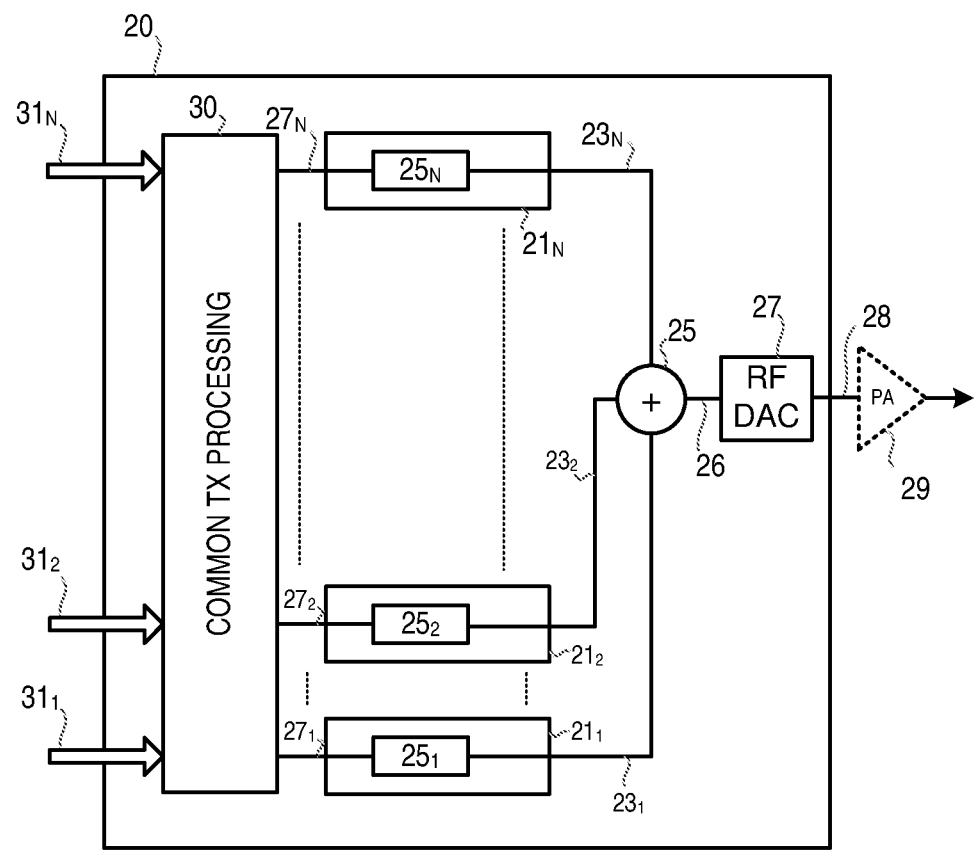
FIG. 3 shows a radio communication transmitter apparatus according to another embodiment of the present invention.

FIG. 3 shows a radio communication receiver apparatus 20 according to another embodiment of the present invention. As with FIG. 2a, the radio communication transmitter apparatus 20 is operable to transmit multiple radio frequency bands in a telecommunication system. The radio communication transmitter apparatus 20 comprises a plurality of digital transmitter chains $21_1$ to $21_N$. Each digital transmitter chain is coupled to receive a digital representation $27_1$ to $27_N$ of a respective base band signal. Each digital transmitter train $21_1$ to $21_N$ comprises a digital transmitter $25_1$ to $25_N$ that is configured to up-convert a digital baseband signal directly to a digital representation of a radio frequency signal $23_1$ to $23_N$. For example, a digital transmitter $25_1$ to $25_N$ of FIG. 2a (and the other embodiments described below) may comprise a digital transmitter that is configured to up-convert a digital base band signal directly to a radio frequency signal using Direct Radio Frequency Technology, DRF.

A digital combining unit 25, for example a digital summing unit, is coupled to receive the output of each digital transmitter chain $21_1$ to $21_N$, and adapted to combine the digital representation of a radio frequency signal $23_1$ to $23_N$ received from each digital transmitter chain $21_1$ to $21_N$ into a digital representation of a radio frequency signal 26 comprising multiple radio frequency bands.

A digital to analogue converter 27 is coupled to receive the digital representation of a radio frequency signal 26 comprising multiple radio frequency bands, and adapted to convert the digital representation of a radio frequency signal 26 into an analogue radio frequency signal 28 comprising multiple radio frequency bands.

The radio communication transmitter apparatus 20 of FIG. 3 further comprises a common processing unit 30. The common processing unit 30 is coupled to receive multiple base band carrier signals $31_1$ to $31_N$, and is adapted to digitally process the multiple base band carrier signals to produce the digital representation $27_1$ to $27_N$ of each base band signal for each of the digital receiver chains.

It can therefore be seen that the multi band transmitter is fed by base band carrier signals, for different carriers and frequency bands, to the common processing block 30. The common processing block may be configured to perform processing tasks such as crest factor reduction (CFR, CFAR) or digital pre-distortion (DPD). It is noted that the embodiments described herein relate to just one example of a DPD implementation, and that other implementations are possible, for example DPD on base band signals for multi frequency band transmitters, without departing from the scope of the invention as defined in the appended claims. The processed (or corrected) base band signal for each frequency band is then fed to a respective DRF digital transmitter that digitally converts the base band signal to digital RF in the right frequency band. The digital RF signals from different frequency bands are combined in the digital combining unit 25 into one digital signal 26 that is fed to the high speed DAC 27.

Figure 4:
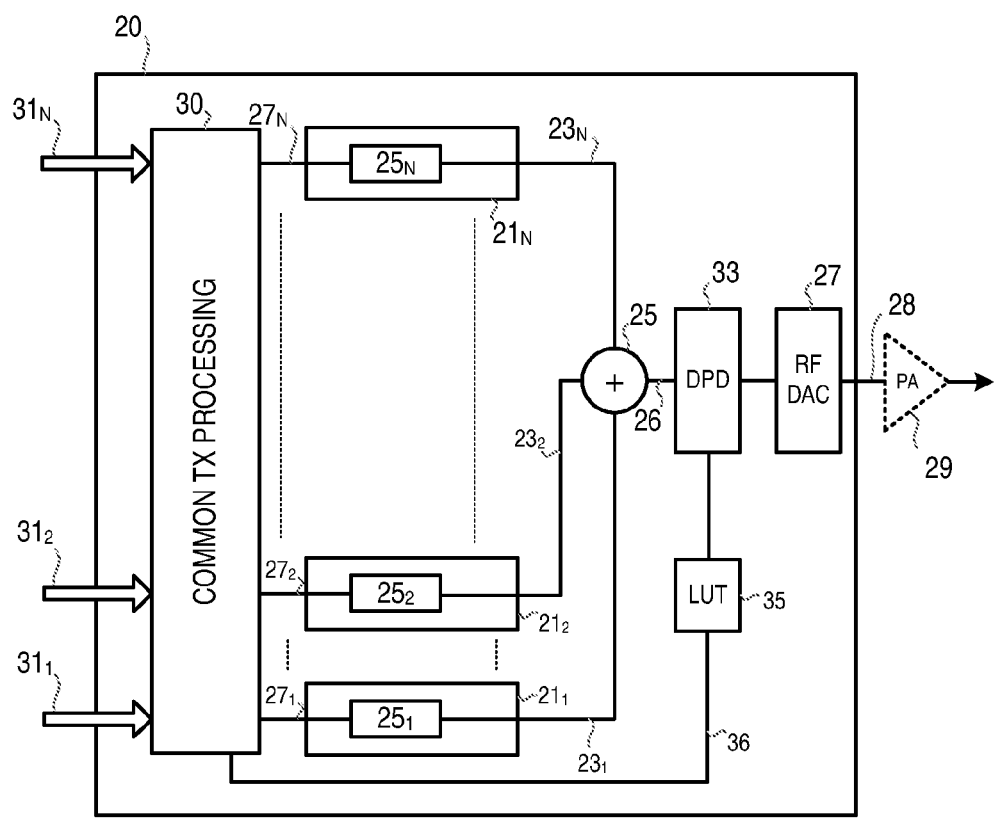
FIG. 4 shows a radio communication transmitter apparatus according to another embodiment of the present invention.

FIG. 4 shows a radio communication transmitter apparatus 20 as described above in relation to FIGS. 2a and 3, but further comprising a digital pre-distortion unit 33 (DPD) coupled between the digital combining unit 25 and the digital to analogue converter 27. The digital pre-distortion unit 33 is configured to modify the digital representation of a radio frequency signal 26 comprising multiple radio frequency bands prior to conversion by the digital to analogue converter 27. In order to handle the multiple bands, the digital pre-distortion unit 33 may be configured to deal with characteristics of the multiple bands, such as one or more of the spacing between bands, the width of each band, the frequency range of each band, and so forth.

A look-up table 35 (LUT) is provided for controlling the operating parameters of the digital pre-distortion unit 33, wherein the look-up table is controlled by the common processing unit 30 using a control signal 36. The control signal 36 may be based on a feedback signal received by the common processing unit 30, for example as described below in FIG. 5.

Each of the embodiments described above and below can feed a wide band power amplifier 29 for amplifying the analogue radio frequency signal 28 comprising multiple radio frequency bands.

Figure 5:
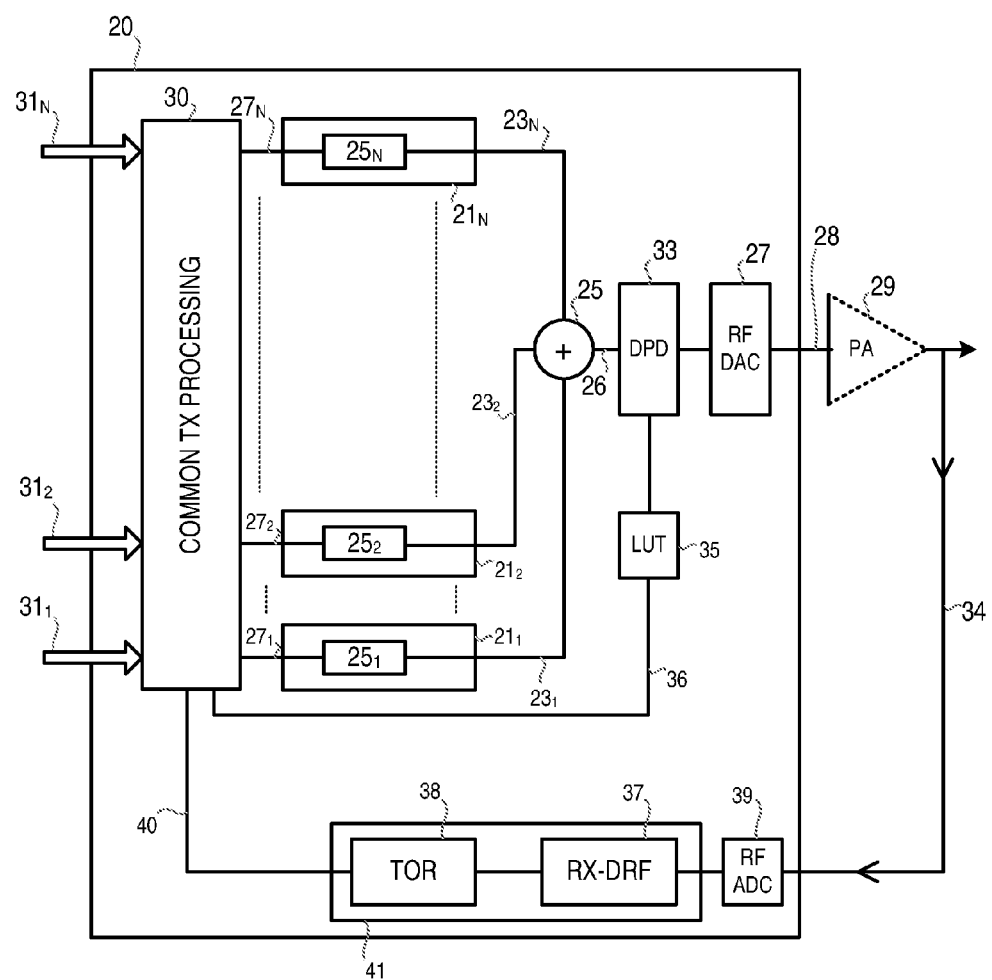
FIG. 5 shows a radio communication transmitter apparatus according to another embodiment of the present invention.

FIG. 5 shows a further embodiment of a radio communication transmitter apparatus 20, similar to the embodiments of FIGS. 2a, 3 and 4. The radio communication transmitter apparatus 20 of FIG. 5 further comprises a feedback unit 41 coupled to monitor an output signal of the transmitter, for example by taking the output of a power amplifier 29, and adapted to provide a feedback signal 40 to the common processing unit 30. Alternatively, the feedback unit 41 can derive its input signal by coupling to a transmit antenna (not shown) that is fed by a power amplifier (29). The feedback unit 41 comprises a digital receiver 37 (for example a DRF receiver) coupled to the output of the power amplifier 29 (or antenna) via a high speed radio frequency ADC 39. The feedback unit 41 also comprises a transmitter observation receiver 38, TOR, coupled to receive an output of the digital receiver 37. As such, a measurement signal, decoupled at the power amplifier (or antenna after the power amplifier) is fed to a digital TOR for RF signal characterization. The characterized RF signal is fed as a feedback signal 40 into the common processing unit 30 for DPD processing. The function of the digital TOR 38 will be familiar to a person skilled in the art, for example as described in a paper entitled "Linearizing Power Amplifiers Using Digital Predistortion, EDA Tools and Test Hardware", by Kelly Mekechuk et al, April 2004, *High Frequency Electronics* journal. The TOR 38 preferably comprises a frequency agile multiband capability, for example a wideband reduced dynamic range version of a DRF receiver, such that it can measure the output signal of the transmitter, including the distortion components. It is noted that the dynamic range can be reduced relative to an ordinary RBS receiver as the transmitter signal is measured directly at the output of the transmitter without the additional path loss added in a real system. The digital TOR (DTOR) is reused for all carriers in all frequency bands. Thus, this embodiment of the invention has the advantage of enabling a common DTOR to be used for the multiple frequency band signals.

Figure 6:
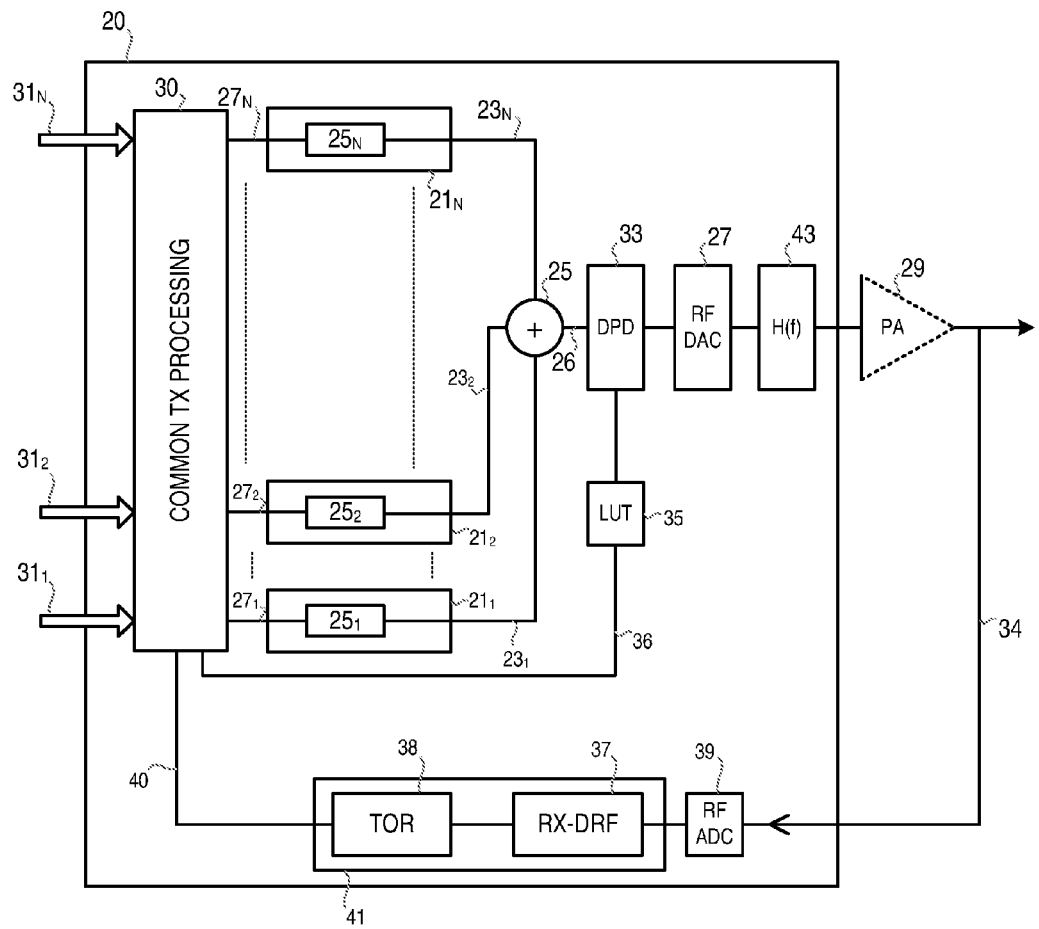
FIG. 6 shows a radio communication transmitter apparatus according to another embodiment of the present invention.

FIG. 6 shows a further embodiment of a radio communication transmitter apparatus 20, similar to those shown in FIGS. 2a, 3, 4 and 5. The radio communication transmitter apparatus 20 of FIG. 6 is further adapted such that unwanted RF signals from the DAC 27 are filtered out in a common filter unit 43, for example a filter unit that performs an anti aliasing filtering function combined with selection of frequency bands of operation. The radio communication transmitter apparatus 20 of FIG. 6 therefore comprises a wide band filter unit 43 coupled to the output of the digital to analogue converter 27, the wide band filter unit 43 being adapted to perform an anti aliasing function combined with a selection of operating frequency bands on the analogue radio frequency signal 28 comprising multiple radio frequency bands. The wide band filter unit 43 has the advantage of being physically small and low cost (that is, small or having an insignificant size in relation to the DAC and the overall transmitter implementation).

Figure 7:
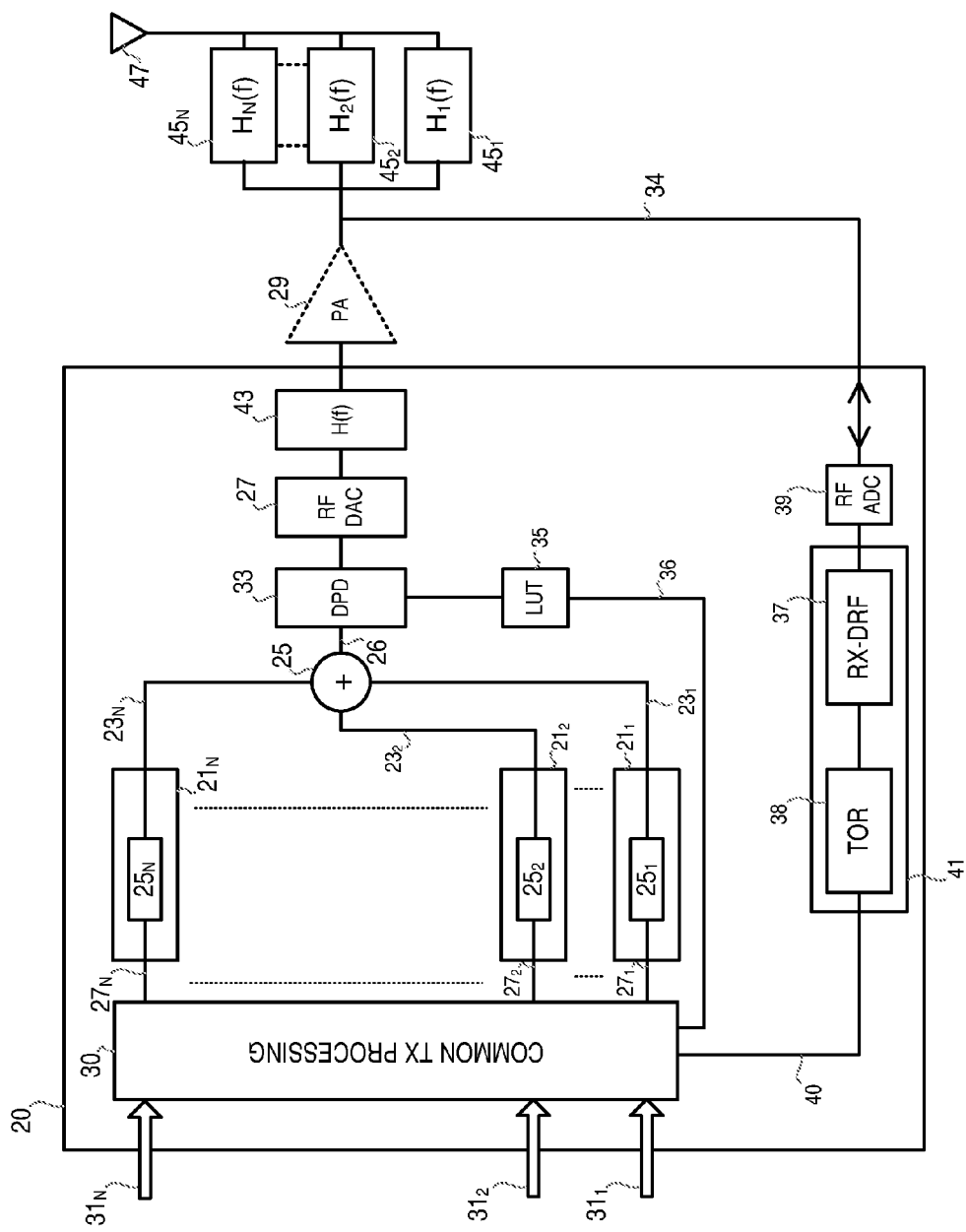
FIG. 7 shows a radio communication transmitter apparatus according to another embodiment of the present invention.

FIG. 7 shows a typical application of the embodiments described above, whereby the radio communication transmitter apparatus further comprises a plurality of output filter units $45_1$ to $45_N$ coupled to the output of a wide band power amplifier 29. Each of the plurality of output filter units is adapted to receive the amplified analogue radio frequency signal 28 comprising multiple radio frequency bands, and adapted to filter a required radio frequency band for coupling to an antenna 47. The frequency specific output filter units filter out respective wanted RF signals, which are combined and fed to the transmitter antenna 47.

Figure 8:
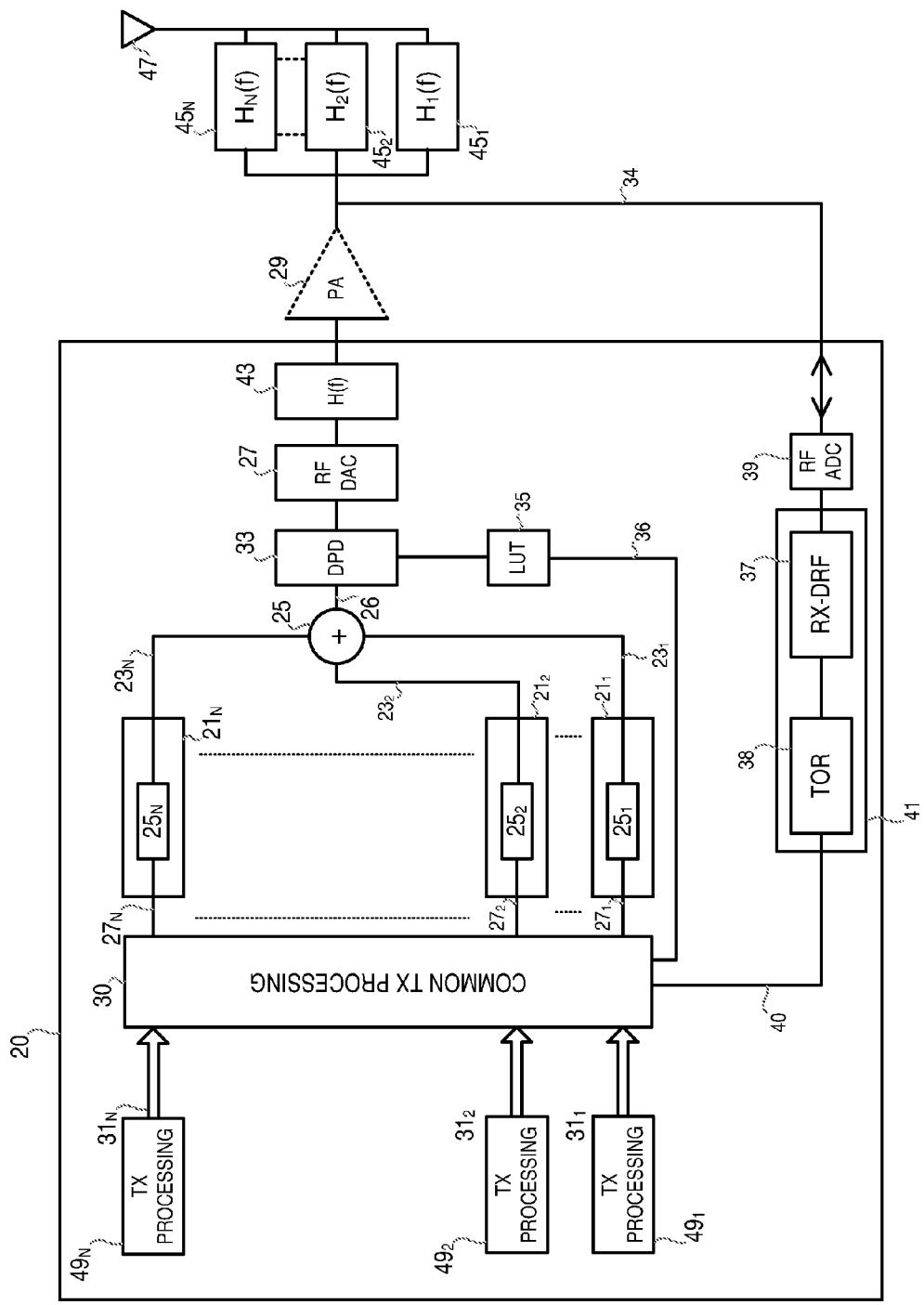
FIG. 8 shows a radio communication transmitter apparatus according to another embodiment of the present invention.

FIG. 8 shows yet a further embodiment of a radio communication transmitter apparatus 20, similar to those shown in FIGS. 2a, 3, 4, 5, 6 and 7. The communication transmitter apparatus 20 of FIG. 8 further comprises a plurality of base band carrier processing units $49_1$ to $49_N$, each base band carrier processing unit adapted to process a base band carrier signal prior to being processed by the common processing unit 30. The plurality of base band carrier processing units $49_1$ to $49_N$ may perform, for example, PreCoder functions or Inverse Fast Fourier Transforms (IFFT) on the base band signals. The plurality of base band carrier processing units $49_1$ to $49_N$ are fed by base band signals, for different carriers and frequency bands.

As can be seen from the above, the embodiments of the invention have the advantage of providing power efficiency due to common component utilization.

The embodiments of the invention also provide the advantages of enabling a frequency agnostic transmitter to be realised, and providing a multi band, multi carrier and multi antenna transmitter.

It is noted that the various features shown in each of the embodiments of FIGS. 2a, 3, 4, 5, 6, 7 and 8 may be combined or interchanged in any manner. For example, an embodiment having a feedback unit 41 may be used without any DPD unit 33 or filter unit 43, or an embodiment having a filter unit 43 may be used without any DPD 33 or feedback unit 41, and so forth.

The embodiments above can use Direct RF, direct digital to RF conversion, to provide RF re-configurability over wide RF bandwidths. The embodiments can be used in various kinds of wireless base stations where wide RF bandwidth operation, carrier aggregation, wide instantaneous bandwidth, small size and low power consumption are desirable. Examples of such base stations are advanced active antennas, main -remote base stations with many transmit/receive branches (2-4-8 for example). Future wireless base stations should preferably be able to operate over many frequency bands that are widely separated in frequency. The frequency band combinations used will be different in different countries/regions and thus the high RF frequency setting flexibility provided by the proposed embodiments based on DRF based architectures has many advantages.

In the DRF based solutions the up/down conversion is moved from the analogue parts to the digital parts, and can be integrated into ASIC's. Digital signal processing also provides high accuracy and flexibility compared to analogue solutions that suffer from impairments that limit the useful bandwidths.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfill the functions of several units recited in the claims. Any reference signs in the claims shall not be construed so as to limit their scope.

The invention claimed is:

1. A radio communication transmitter apparatus operable to transmit multiple radio frequency bands in a telecommunication system, the apparatus comprising:
a plurality of base band carrier processing circuits, wherein each base band carrier processing circuit is adapted to process a respective base band carrier signal;
a common processing circuit coupled to receive the output of each base band carrier processing circuit, and adapted to digitally process the base band carrier signals received from each base band carrier processing circuit to produce a digital representation of each base band signal;
a plurality of digital transmitter chains, wherein each digital transmitter chain is coupled to receive the digital representation of a respective base band signal from the common processing circuit, and wherein each digital transmitter chain comprises a digital transmitter that is configured to convert a respective digital base band signal directly into a digital representation of a radio frequency signal;
a digital combining circuit coupled to receive the output of each digital transmitter chain, and adapted to combine the digital representation of a radio frequency signal received from each digital transmitter chain into a digital representation of a radio frequency signal comprising multiple radio frequency bands; and
a digital-to-analog converter coupled to receive the digital representation of a radio frequency signal comprising multiple radio frequency bands and adapted to convert the digital representation of a radio frequency signal into an analog radio frequency signal comprising multiple radio frequency bands.

2. The radio communication transmitter apparatus of claim 1, further comprising a digital pre-distortion (DPD) circuit coupled between the digital combining unit and the digital-to-analog converter and adapted to modify the digital representation of a radio frequency signal comprising multiple radio frequency bands prior to conversion by the digital-to-analog converter.

3. The radio communication transmitter apparatus of claim 2, further comprising a look-up table for controlling the operating parameters of the pre-distortion unit, wherein the look-up table is controlled by the common processing unit.

4. The radio communication transmitter apparatus of claim 1, further comprising a wide-band power amplifier for amplifying the analog radio frequency signal comprising multiple radio frequency bands.

5. The radio communication transmitter apparatus of claim 4, further comprising a feedback circuit coupled to monitor the output of the power amplifier and adapted to provide a feedback signal to the common processing unit.

6. The radio communication transmitter apparatus of claim 5, wherein the feedback circuit comprises:
- a digital receiver coupled to the output of the power amplifier; and
- a transmitter observation receiver coupled to receive an output of the digital receiver.

7. The radio communication transmitter apparatus of claim 4, further comprising a plurality of output filters coupled to the output of the wide band power amplifier, each of the plurality of output filters being adapted to receive the amplified analog radio frequency signal comprising multiple radio frequency bands and adapted to filter a required radio frequency band for coupling to an antenna.

8. The radio communication transmitter apparatus of claim 1, further comprising a wide band filter coupled to the output of the digital-to-analog converter, the wide band filter being adapted to perform an anti-aliasing function on the analog radio frequency signal comprising multiple radio frequency bands.

9. A method in a radio communication transmitter apparatus that is operable to transmit multiple radio frequency bands in a telecommunication system, the method comprising:
- processing a plurality of base band carrier signals using a plurality of base band carrier processing circuits;
- receiving the plurality of base band carrier signals from the plurality of base band carrier processing circuits at a common processing circuit and digitally processing the plurality of base band carrier signals to produce a digital representation of each base band signal;
- receiving, in each of a plurality of digital transmitter chains from the common processing circuit, the digital representation of a respective base band signal for processing by a respective digital transmitter chain;
- converting, at each digital transmitter chain, a respective digital base band signal directly into a digital representation of a radio frequency signal;
- combining the digital representation of a radio frequency signal of each digital transmitter chain into a digital representation of a radio frequency signal comprising multiple radio frequency bands; and
- converting the digital representation of a radio frequency signal comprising multiple radio frequency bands into an analog radio frequency signal comprising multiple radio frequency bands.

10. The method of claim 9, further comprising digitally pre-distorting the output of the combining circuit prior to converting the digital representation of a radio frequency signal comprising multiple radio frequency bands into an analog signal.

11. The method of claim 10, further comprising controlling the operating parameters of the pre-distortion unit using a look-up table, wherein the look-up table is controlled by the common processing circuit.

12. The method of claim 9, further comprising amplifying the analog radio frequency signal comprising multiple radio frequency bands using a wide-band power amplifier.

13. The method of claim 12, further comprising monitoring the output of the power amplifier to provide a feedback signal and controlling the operation of the common processing circuit based on the feedback signal.

14. The method of claim 13, wherein said monitoring comprises the steps of:
- coupling a digital receiver to the output of the power amplifier; and
- coupling a transmitter observation receiver to an output of the digital receiver, such that the output of the transmitter observation receiver forms the feedback signal for the common processing circuit.

15. The method of claim 12, further comprising filtering the output of the wide band power amplifier using a plurality of output filters, each of the plurality of output filters being adapted to receive the amplified analog radio frequency signal comprising multiple radio frequency bands and to filter a corresponding radio frequency band for coupling to an antenna.

16. The method of claim 9, further comprising filtering the output of the digital-to-analog converter using a wide-band filter, wherein said filtering comprises performing an anti-aliasing function on the analog radio frequency signal comprising multiple radio frequency bands.

* * * * *